United States Patent [19]

Coultas et al.

[11] 3,997,846
[45] Dec. 14, 1976

[54] METHOD AND APPARATUS FOR ELECTROSTATIC DEFLECTION OF HIGH CURRENT ION BEAMS IN SCANNING APPARATUS

[75] Inventors: Dennis Keith Coultas, Beacon; John Howard Keller, Newburgh; James Robert Winnard, Poughkeepsie, all of N.Y.

[73] Assignee: International Business Machines Corporation, Armonk, N.Y.

[22] Filed: June 30, 1975

[21] Appl. No.: 592,013

[52] U.S. Cl. ............................... 328/229; 313/421; 313/427; 313/432
[51] Int. Cl.² ................... H01J 29/56; H01J 29/70
[58] Field of Search ........... 328/228, 229; 313/421, 313/426, 432, 437; 315/370, 371

[56] References Cited
UNITED STATES PATENTS

| 2,237,671 | 4/1941 | Kallmann | 313/432 |
| 2,957,141 | 10/1960 | Jernakoff | 328/129 |
| 3,040,205 | 6/1962 | Walker | 313/432 X |
| 3,313,969 | 4/1969 | Wolter | 328/229 X |
| 3,535,880 | 10/1970 | Work et al. | 60/202 |
| 3,887,834 | 6/1975 | Himmelbauer | 315/31 R |

Primary Examiner—R. V. Rolinec
Assistant Examiner—Vincent J. Sunderdick
Attorney, Agent, or Firm—James M. Thomson

[57] ABSTRACT

A novel method and apparatus for achieving electrostatic deflection of high current ion beams within a scanning apparatus. In one embodiment, a pair of gates are provided, with one gate being oriented proximate each side of the deflection plates, and each gate being biased to a negative voltage of a sufficient amplitude to repel electrons which otherwise would be attracted to the positively-biased deflection plates to thereby protect the electron cloud from degradation, and maintain space charge neutralization of the ion beam. In another embodiment, means are provided to drive the deflection plates at negative voltages at all times and to maintain portions of the ground tube of the apparatus adjacent the deflection plates at a ground or negative level in order to avoid degradation of the electron sheath.

6 Claims, 2 Drawing Figures

METHOD AND APPARATUS FOR ELECTROSTATIC DEFLECTION OF HIGH CURRENT ION BEAMS IN SCANNING APPARATUS

BACKGROUND OF THE INVENTION

This invention relates to a novel method and apparatus for deflecting high current ion beams. More particularly, the invention concerns a method of retaining space-charge neutralization of the ion beam by preserving the electron cloud formed about the ion beam along the beam path.

In ion beam apparatus, such as accelerators and/or scanning apparatus, it is usual to produce a beam of ions from a suitable ion source and to control the movement of such ions along a predetermined path or trajectory through a vacuum environment, such as that provided by an evacuated cylinder or beam channel which is normally held at ground potential. It has been recognized, however, that such a beam channel cannot be perfectly evacuated. It has been suggested theoretically that electrons are formed, largely due to ionization, by collisons occuring between the positively charged ions and molecules of gas which exist within the vacuum chamber. Moreover, additional electrons are created upon impact of the ions against the target in the case of a scanning apparatus. Such electrons, due to their characteristic negative charge tend to be attracted to the positively charged ion beam.

Accordingly, the electrons have been found to form a cluster or cloud around the ion beam which tends to maintain the shape of the ion beam. Ordinarily, the positively charged ions exhibit an inherent tendency to diverge from each other in the absence of the electron cloud between the source and the target. However, the presence of electrons impart charge neutralization to the beam which enables deflection of relatively high current ion beams along a lengthy beam path without loss of resolution.

However, heretofore in the prior art, deflection plates oriented along the beam path to control the deflection of the ion beam, such as is necessary to scan a given target in a predetermined fashion, have been driven with alternating current signals, usually about a balanced ground. Thus, the positively charged ions are passed between a pair of parallel deflection plates which are alternately energized by a relatively high positive voltage level. It should be apparent that in such instances the positively charged plate, in the absence of other field influences, tends to attract negatively charged electrons. The same effect is observed when a positively charged probe is placed in the vacuum tube at a location proximate the ion beam path.

It has been recognized that the use of a positively charged deflection plate will tend to attract sufficient secondary electrons to degrade or destroy the electron cloud at least in a region proximate the deflection plates, if not throughout most the length of the beam path. This, in turn, has led to limitations upon the magnitude of high current ion beams which could be successfully controlled by the usual deflection techniques within a scanning apparatus.

Consequently, there is a need in the art for means for eliminating the destruction of the electron cloud in ion beam systems whereby deflection of high current ion beams can be accomplished.

SUMMARY OF THE INVENTION

Accordingly, it is an object of the invention to provide a method and apparatus for accomplishing deflection of high current ion beams in a scanning apparatus.

It is another object of the invention to provide a method and apparatus for deflecting high current ion beams wherein the protective electron cloud contributing to space charged neutralization of the ion beam is not disturbed by the deflection fields.

These and other objects of the invention are attained in a system wherein a pair of deflection plates are provided which are oriented with respect to an ion trajectory or path so as to deflect ions emanating from an ion source and traversing the ion path toward a target which is to be scanned under the control of the deflection plates. It is envisioned that one or more sets of horizontal and vertical deflection plates will be provided in the apparatus. With respect to each set of deflection plates, a pair of gates are provided proximate to the leading and trailing edge of the deflection plates, respectively. The gates are energized by a sufficiently high negative voltage to prevent electrons from entering the region defined between the deflection plates and the gates. Accordingly, electrons cannot attach or cloud about the positively biased deflection plate. In an alternative form of the invention, the deflection plates are biased, at all times, at a negative voltage whereby electrons, again, are not attracted to the deflection plates and the electron cloud formed about the ion beam remains relatively undisturbed.

BRIEF DESCRIPTION OF THE DRAWINGS

The foregoing and other objects, features and advantages of the invention will become apparent from the following detailed description of the invention taken in conjunction with the accompanying drawings wherein.

DETAILED DESCRIPTION OF THE INVENTION

Figure 1:
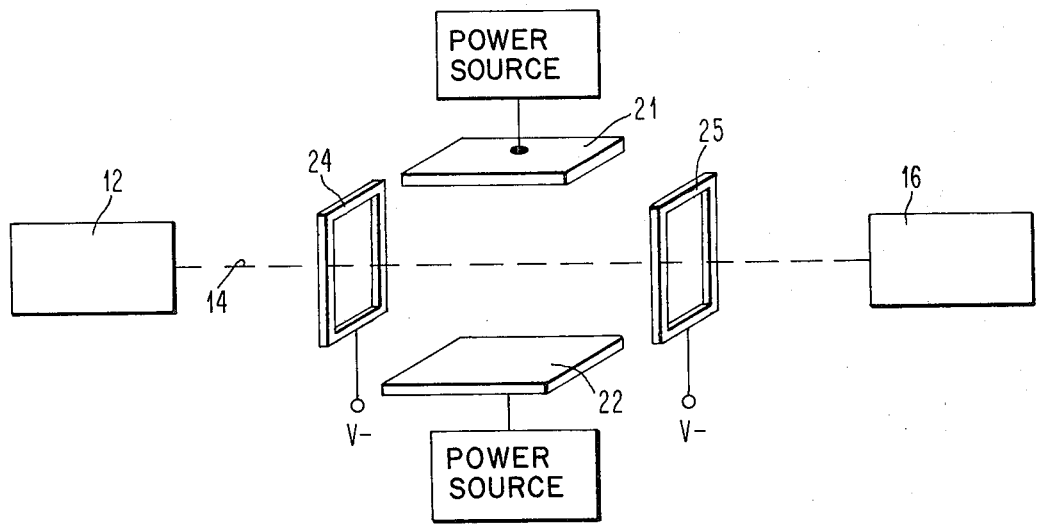
FIG. 1 is a schematic representation of one embodiment of the invention.

Referring now to the drawings and particularly to FIG. 1, one preferred embodiment of the invention is illustrated comprising a schematically illustrated scanning apparatus including a conventional ion source 12 adapted to provide ions which are accelerated and deflected along an evacuated ion path 14 toward a targed 16. It is envisioned that the ion beam emanating from source 12 will be controlled in the usual fashion to scan target 16 in a predetermined fashion to achieve an end result, such as ion implantation of microelectronic devices, for example.

A pair of vertical deflection plates 21, 22 are schematically illustrated in FIG. 1 located proximate to the beam path at points equidistant therefrom to deflect the ion beam in a vertical direction in a conventional manner. As shown, the deflection plates are adapted to be energized by a suitable alternating source of power having a predetermined amplitude. In well known fashion, the positively charged ions in the beam are deflected toward the negatively charged deflection plate and upon polarity reversal of the deflecting signal the ion beam is deflected toward the opposite deflection plate.

A pair of gates 24, 25 are also provided, being positioned proximate to the leading and trailing edges of deflection plates 21, 22. In the embodiment illustrated, the gates are formed of conductive material shaped in a rectangular configuration, with the ion beam adapted to pass through the center of the rectangular region. The gates are each adapted to be energized from a suitable source to a negative potential sufficiently high to repel or screen electrons from within the region bounded roughly by the gates and deflection plates. Accordingly, it should be apparent that any electrons outside the aforementioned region, which would otherwise be attracted to the positively charged deflection plate, will be repelled by the negatively charged gates.

The only electrons which will be removed from the electron cloud of the ion beam are those existing within the region proximate the deflection plates. Since the deflection plates are relatively small with respect to the length of the beam path, it has been found that the effect of using gates 24, 25 is satisfactory to prevent stripping of the electron cloud from the ion beam. This allows maintenance of a space charge neutral ion beam and permits the deflection of higher current ion beams than was heretofore possible. It should be apparent that the use of rectangular gates surrounding the ion beam path is not necessary. Rather, a plurality of negatively charged probes extending through the ground wall of the scanning apparatus could be utilized, as well.

Figure 2:
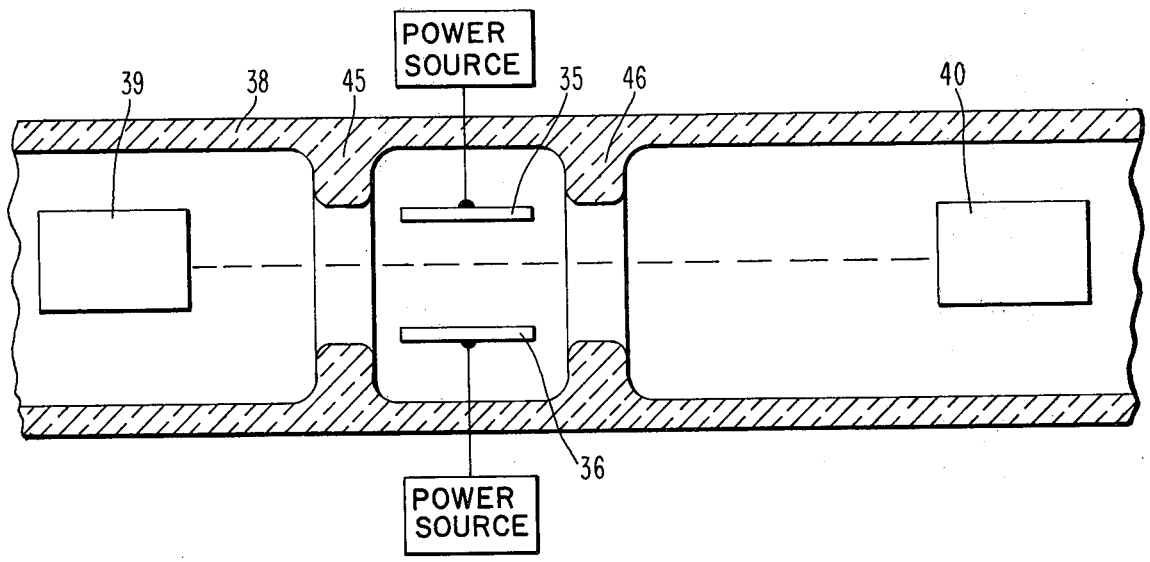
FIG. 2 is a schematic representation of an alternative embodiment of the invention.

Referring now to FIG. 2, an alternative form of the invention is disclosed wherein deflection plates 35, 36 are oriented within a ground tube 38 which is evacuated in well known fashion. A source 39 is illustrated at one end of the ground tube and a target 40 is illustrated at the other end of the ground tube, again in well known fashion. As shown, portions 45, 46 of the ground tube proximate either end of deflection plates 35, 36 are formed with a reduced diameter whereby such regions proximate the ends of the deflection plate are partially constricted.

It is within the purview of the present invention to utilize such reduced portions as gates and in that event such portions could be charged to a negative potential in the same fashion as gates 24, 25 of FIG. 1. It is also within the purview of the invention to maintain regions 45, 46 at a ground potential and to drive deflection plates 35, 36 at alternating levels of voltage which always are sufficiently negative whereby the voltage affecting the ion beam in the region between portions 45 and 46 is negative. Thus, in the embodiment illustrated, electrodes 35, 36 might be energized at an alternating voltage level having peak-to-peak variations ranging between −100 and −20,000 volts about a −50 and −10,000 volt axis. In such an event, both of the deflection plates always remain at a negative voltage with respect to the ion beam and therefore do not tend to strip electrons from the ion beam. Again, the effect is to protect the space charge neutralization of the ion beam along the desired path whereby a higher current ion beam can be deflected across the target in a desired fashion.

The foregoing embodiments of the invention have enabled operation of ion beam apparatus at high current levels in a range above 0.2 milliamps which were heretofore unobtainable by conventional ion systems, and which involve the use of scanning techniques which have never heretofore been employed. It should be apparent that each set of deflection plates within the beam path be provided with gates at each end thereof to prevent disturbance of the electron cloud.

What is claimed is:

1. In an ion beam apparatus including an ion source adapted to project a high current ion beam along a path within a vacuum region toward a target,
    deflection plate means for deflection of said ion beam with respect to said target in a controlled fashion, and
    field gate means arranged proximate said deflection plate means for excluding electrons from entering the region defined between said deflection plate means and said gate means whereby the electron cloud formed about said ion beam remains undisturbed in regions away from the location of said deflection plate means.

2. The apparatus of claim 1 wherein
    said field gate means comprise negatively biased conductive members oriented near leading and trailing edges of said deflection plate means.

3. The apparatus of claim 2 wherein
    said conductive members are of generally rectangular configuration having a central opening defined therein for passage of the ion beam.

4. The apparatus of claim 1 wherein
    said field gate means comprise portions of an evacuation tube surrounding said deflection plate means.

5. The apparatus of claim 4
    further including means for biasing said portion of said evacuation tube at predetermined negative voltage levels.

6. The apparatus of claim 4
    further including means for biasing said deflection electrode means at a voltage level sufficiently negative to insure that the voltage affecting the ion beam in the region between the deflection electrode means is always negative.

* * * * *